United States Patent [19]
Ference

[11] Patent Number: 5,904,502
[45] Date of Patent: May 18, 1999

[54] MULTIPLE 3-DIMENSIONAL SEMICONDUCTOR DEVICE PROCESSING METHOD AND APPARATUS

[75] Inventor: Thomas George Ference, Essex Junction, Vt.

[73] Assignee: International Business Machines Corporation, Armonk, N.Y.

[21] Appl. No.: 08/923,162

[22] Filed: Sep. 4, 1997

[51] Int. Cl.[6] .......................... H01L 21/44; H01L 21/48; H01L 21/50
[52] U.S. Cl. .............................. 438/118; 438/106; 438/26
[58] Field of Search .................................. 438/118, 106, 438/26

[56] References Cited

U.S. PATENT DOCUMENTS

| | | | |
|---|---|---|---|
| 4,617,160 | 10/1986 | Belanger et al. | 264/40.1 |
| 4,999,311 | 3/1991 | Dzarnoski, Jr. et al. | 437/51 |
| 5,019,946 | 5/1991 | Eichelberger et al. | 361/414 |
| 5,107,586 | 4/1992 | Eichelberger et al. | 29/830 |
| 5,279,991 | 1/1994 | Minahan et al. | 437/208 |
| 5,306,670 | 4/1994 | Mowatt et al. | 438/126 |
| 5,478,781 | 12/1995 | Bertin et al. | 438/118 |
| 5,506,753 | 4/1996 | Bertin et al. | 361/705 |
| 5,547,530 | 8/1996 | Nakamura et al. | 438/613 |
| 5,663,104 | 9/1997 | Fukuyama | 438/124 |
| 5,688,721 | 11/1997 | Johnson | 438/118 |

*Primary Examiner*—Kevin M. Picardat
*Assistant Examiner*—Deven Collins
*Attorney, Agent, or Firm*—James M. Leas

[57] ABSTRACT

A method of making a multiple 3-dimensional semiconductor device substrate includes the steps of providing a plurality of devices each device including a semiconductor die and having a reference face requiring a subsequent face processing. The reference face of each of the plurality of devices is positioned upon a planar reference surface. The planar reference surface corresponds to a release layer having vacuum apertures disposed therein. The plurality of devices can be precisely aligned in a prescribed manner upon the release layer, wherein application of a vacuum source to the vacuum apertures holds the plurality of aligned devices at their respective reference faces upon the release layer. Molding compound is dispensed into gaps occurring between adjacent side faces of the plurality of devices other than the reference faces. Lastly, the molding compound is cured. A multiple 3-dimensional semiconductor device substrate is disclosed also.

15 Claims, 5 Drawing Sheets

MULTIPLE 3-DIMENSIONAL SEMICONDUCTOR DEVICE PROCESSING METHOD AND APPARATUS

BACKGROUND OF THE INVENTION

1. Field of the Invention

This invention relates generally to a method and apparatus for high density electronic packaging and, more particularly, to a method and apparatus adapted to process multiple 3-dimensional semiconductor devices at a single time.

2. Discussion of the Related Art

In semiconductor packaging applications, stacks of individual semiconductor chips or die are joined together to form a 3-dimensional device referred to as a cube. A method for fabricating cubes or modules including uniformly stacked, aligned circuit carrying layers is disclosed, for example in U.S. Pat. No. 4,617,160, issued to Belanger et al. on Oct. 14, 1986.

A first phase of cube processing is performed while the semiconductor chips are still in wafer form. During the first phase, input/output (I/O) leads are brought from an active area of the die to the kerf region using, for example, a thin film transfer wiring level. The die are then separated by dicing. The act of dicing exposes the thin film wire I/O on a corresponding edge of each die. During a second phase of cube processing, a 3-dimensional device or cube is formed by laminating a stack of the diced semiconductor chips together, back to front. A third phase of the cube processing is performed on one or more processing surfaces of a cube. The third phase of cube processing includes processing steps such as polishing, spin apply of an insulative layer, evaporation of a metalization layer, lithography and etching steps used to interconnect the transfer wire I/O's from one chip to the next for a particular cube.

In the present state of the art, cubes are processed individually one at a time. Each process step typically involves a special fixture, wherein an individual cube must be fitted into the special fixture. As a result, there are a multiplicity of different fixtures, one for each process step. Each cube must then be fixtured a multiplicity of times during the subsequent processing thereof. Extra handling care and process steps are needed when processing each cube individually. Furthermore, mechanically fixturing of individual cubes into a multi-up fixture is difficult, time consuming, and poses additional processing challenges. Still further, if different size cubes are processed due to the use of different size chips resulting from technology shrinks or the use of different technologies, then the tools may also have to be refitted with a new set of fixtures. This further adds excessive cost to the fabrication of cubes.

Additionally, the present known fixtures suffer disadvantages. Because of cube to cube size variations, gaps on the order of as little as 25 μm can occur between individual cubes and corresponding fixtures. Such gaps disadvantageously lead to formation of edge beads (e.g., resulting from a build up of spun-on materials), cracking of the cube edges, and the occurrence of material undesirably filling the gaps and gluing the cube into the corresponding fixture.

More particularly, edge beads, corresponding to thick areas of polyimide and/or photoresist on the edge of a cube, build up during spinning even if only a small gap (25–100 μm) exists between the fixture and cube edge. Cube to cube size variation is typically large enough to make such tight fixturing difficult to impossible. An edge bead disadvantageously interferes with the processing of the outer most leads on a cube face.

When grinding and polishing a cube face, the cube needs to be held securely so that no movement occurs, otherwise a nonplanar cube face will result. Similarly, gaps between the fixture and the cube can lead to movement of the cube and chipping of the silicon making up the cube. Thermal expansion differences between the cube and the fixture are also important. The silicon making up the cube can easily be cracked, chipped, or the cube can fall out of the fixture during processing if the thermal coefficient of expansion (TCE) of the fixture and of the cube are not comparable. Still, further, polyimides and photoresists can undesirably fill any gaps between the cube and fixture. Upon a subsequent thermal processing, those materials will cure, thus locking the cube into the fixture. Removing the cube from the fixture and cleaning the cube after each step is costly and further gives rise to additional handling damage. Thus during individual cube processing, there exists the potential for numerous problems associated with the use of many fixtures, individual cube handling, and inefficient fixtures.

In U.S. Pat. No. 4,999,311, a method of fabricating interconnections to I/O leads on layered electronic assemblies is disclosed. In the '311 patent, layered electronic assemblies are mechanically compressed together, wherein interconnect circuitry is formed on a selected face of several layered electronic assemblies simultaneously. The '311 patent however does not provide a surface for referencing the selected face of the electronic assemblies to be flat. In addition, the electronic assemblies of the '311 patent will also suffer from a tendency to shift around as the assemblies are mechanically compressed together, thus not providing for an accurate known positioning of individual assemblies for subsequent stepwise alignment during processing of individual assemblies.

SUMMARY OF THE INVENTION

An object of the present invention is to provide a method for multiple 3-dimensional device stack processing which overcomes the problems in the art discussed herein above.

According to the present invention, a method of making a multiple 3-dimensional semiconductor device substrate includes the steps of providing a plurality of devices, each device including a semiconductor die and having a reference face requiring a subsequent face processing. The reference face of each of the plurality of devices are positioned upon a planar reference surface. Lastly, the devices are molded together using a molding compound. In one embodiment, each device includes a stack of individual semiconductor die laminated together and having a reference face requiring a subsequent cube face processing.

Still further, molding of the devices together includes providing a molding fixture. The molding fixture includes a release layer corresponding to the planar reference surface and a containment member coupled to the release layer. The containment member defines a desired outer dimension of the multiple 3-dimensional semiconductor device substrate yet to be formed. The release layer is further characterized by vacuum apertures disposed therein, wherein the plurality of devices can be precisely aligned in a prescribed manner upon the release layer and wherein application of a vacuum source to the vacuum apertures holds the plurality of aligned devices at their respective reference faces in the molding fixture. Next, the molding compound is dispensed into gaps occurring between adjacent side faces of the plurality of devices other than the reference faces. Lastly, the molding compound is cured.

The method according to the present invention further includes the step of subjecting the reference faces of the plurality of devices in the form of a multiple 3-dimensional semiconductor device substrate to subsequent face processing. In one instance, each device further includes electrical contact points on the reference face thereof, wherein the subsequent face processing includes electrically connecting desired contact points on the reference face of an individual device with other contact points on the reference face of the same device of the multiple 3-dimensional semiconductor device substrate. Subsequent face processing also includes electrically connecting desired contact points on the reference face of a first device with desired contact points on the reference face of a second device of the multiple 3-dimensional semiconductor device substrate. Still further, subsequent face processing also includes electrically connecting desired contact points of an individual device of the multiple 3-dimensional semiconductor device substrate with an external device.

According to an alternate embodiment of the present invention, the step of molding the devices together includes providing a release layer corresponding to the planar reference surface and a molding template coupled to the release layer. The molding template includes individual apertures each of a sufficient size for receiving an individual device therein. The release layer is characterized by vacuum apertures disposed therein, wherein the apertures of the molding template overlie the vacuum apertures disposed in the release layer. The plurality of devices can be precisely aligned in a prescribed manner upon the release layer within an individual aperture of the molding template and application of a vacuum source to the vacuum apertures holds the plurality of aligned devices at their respective reference faces within the individual apertures of the molding template. Holding compound is dispensed into gaps occurring between a respective molding template aperture side wall and side faces of the plurality of devices other than the reference faces and cured.

The present invention further includes a multiple 3-dimensional semiconductor device substrate structure including a plurality of devices, each device having a stack of individual semiconductor die laminated together and a reference face requiring a subsequent cube face processing. The substrate structure further includes a means for molding the devices together in a prescribed manner wherein the reference faces of the plurality of devices are co-planar with one another. The molding means includes a molding fixture having a removable release layer and a containment member coupled to the release layer. The containment member defines a desired outer dimension of the multiple 3-dimensional semiconductor device substrate. The release layer is characterized by vacuum apertures disposed therein, wherein the plurality of devices can be precisely aligned in a prescribed manner upon the release layer and wherein application of a vacuum source to the vacuum apertures holds the plurality of aligned devices at their respective reference faces in the molding fixture. Holding compound is dispensed into gaps occurring between adjacent cube side faces of the plurality of devices other than the reference faces, the molding compound further being cured.

In addition, the molding means further includes a molding template having individual apertures each of a sufficient size for receiving an individual device therein. The molding template is disposed upon the release layer. The apertures of the molding template overlie vacuum apertures disposed in the release layer, wherein the plurality of devices are precisely aligned in a prescribed manner upon the release layer within an individual aperture and wherein application of a vacuum source to the vacuum apertures holds the plurality of aligned devices at their respective reference faces in the molding fixture. A molding compound is dispensed into gaps occurring between a respective molding template aperture side wall and cube side faces of the plurality of devices other than the reference faces, wherein the molding compound is cured.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

The present invention is directed towards and deals with the third phase of stack or cube processing. That is, the present invention addresses and solves the problems encountered during the third part (or phase) of cube processing. In accordance with the present invention, a plurality of 3-dimensional semiconductor devices or cubes, post lamination and one side polishing, are placed into a fixture, aligned as necessary, and then "potted" in a suitable material, fixing the plurality of cubes in position or place within a multiple 3-dimensional semiconductor device or cube substrate. A base plate of the molding fixture is then removed, wherein the substrate having the plurality of cubes "potted" in place is then used for all subsequent processing of a particular cube face of the plurality of cubes.

Figure 1:
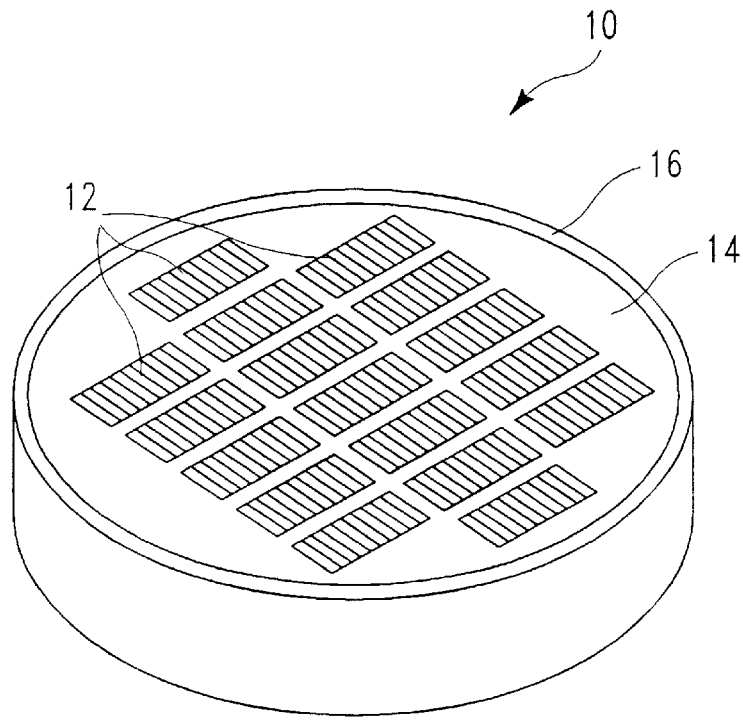
FIG. 1 illustrates a multiple cube substrate and outer containment ring in accordance with the present invention.

According to the present invention, a structure is formed wherein two or more cubes are molded together in the form of a multiple cube substrate. The multiple cube substrate enables all of the cubes to undergo further processing of a processing face thereof all at once. A molding material is used to secure the cubes together in the multiple cube substrate form. The multiple cube substrate is fabricated such that, in its final form, its overall size and shape is invariant even if the individual cube sizes vary and are non-uniform. The multiple cube substrate is then used for all subsequent processing steps on the desired processing face of the multiple cubes. After all cube face processing is completed, the cubes can then be segmented into individual cubes corresponding to reference face processed cubes. FIG. 1 illustrates a multiple cube substrate structure 10 according to one embodiment of the present invention. As shown the stacks of devices or cubes 12 are potted in place with a molding material 14 within a containment ring 16.

Figure 2:
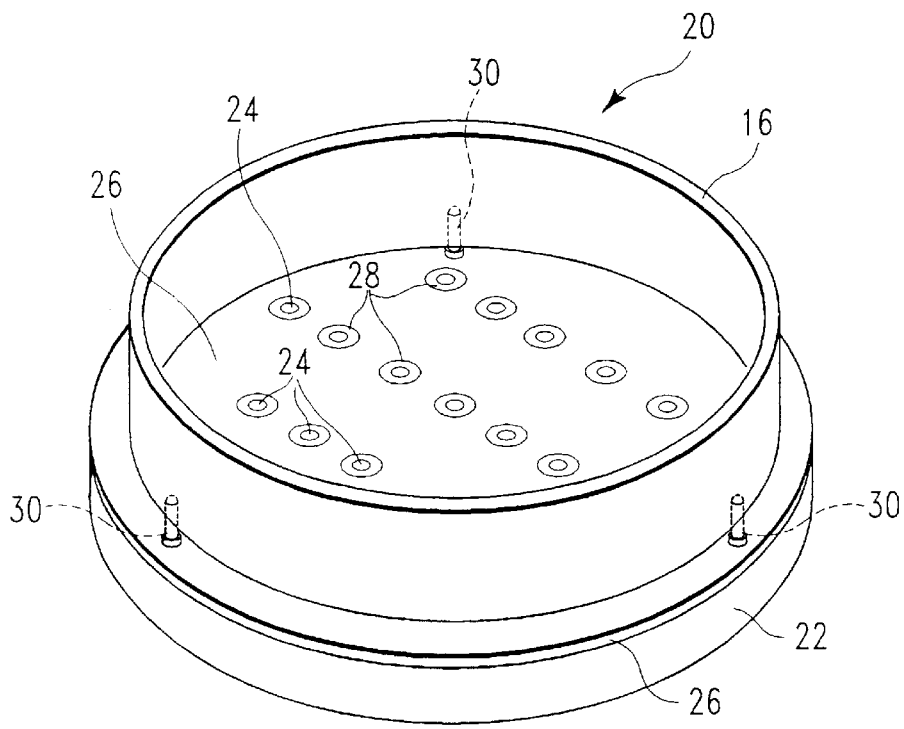
FIG. 2 illustrates a fixture for use in making the multiple cube substrate in accordance with the present invention.

Referring now to FIG. 2, an appropriate mold fixture or holder 20 is provided as desired for defining a desired overall dimension of a multiple cube substrate 10 of FIG. 1, to include a desired number of cubes yet to be molded together. The mold fixture 20 of FIG. 2 includes a base plate 22 and a containment ring 16. The base plate 22 may be made of a metallic material which is structurally rigid and capable of withstanding temperatures, for example, in a range of up to 350° C. The base plate 22 further includes an array of vacuum apertures or holes 24 for pulling a vacuum therethrough. The vacuum apertures 24 are in an array periodicity equal to a periodicity for which the cubes 12 will reside in the final multiple cube substrate 10 (of FIG. 1) yet to be formed.

In a preferred embodiment of the present invention, the containment ring 16 of the mold fixture 20 is provided of a prescribed diameter, such as a diameter of 125 mm or 200 mm. The diameter is appropriately selected so that the resulting multiple cube substrate 10 of FIG. 1 can be readily insertable into standard wafer or multi-chip module (MCM) processing equipment (not shown), such as 125 mm or 200 mm wafer processing equipment, as the case may be. An actual multiple cube substrate 10 may be slightly smaller or appropriately sized so as to fit within 125 mm or 200 mm carrier fixtures that are unite to each processing tool. The molding fixture 20 is used in fabricating a potted plurality of cubes 12, the plurality of cubes 12 to then be further processed in the form of a multiple cube substrate 10.

Referring still to FIG. 2, a release layer 26 is also provided upon the base plate 22. The release layer 26 includes vacuum apertures or holes 28 punched or formed therein to match the vacuum apertures 24 in the base plate. In other words, the vacuum apertures 28 of the release layer 26 are aligned with the vacuum apertures 24 in the base plate 22. The release layer 26 includes any suitable material which can withstand high temperatures and can be easily polished away or removed. Preferably, the release layer 26 includes a porous ceramic green sheet. A green sheet as referred to herein includes a material equivalent to that used in making ceramic multi-chip module (MCM) substrates. The release layer 26 thus includes any material suitable for releasing the plurality of potted cubes 12 therefrom in a subsequent step, as will be discussed further herein below.

The containment ring 16 is secured to the base plate 22 with appropriate fasteners 30, such as screws, to give a leak tight seal between the base plate 22 and containment ring 16. As shown, the containment ring 16 is positioned upon the release layer 26, which is positioned upon the base plate 22. The containment ring 16 can include any suitable metal or high temperature composite material, suitable for withstanding temperatures on the order of greater than 350° C.

Figure 3:
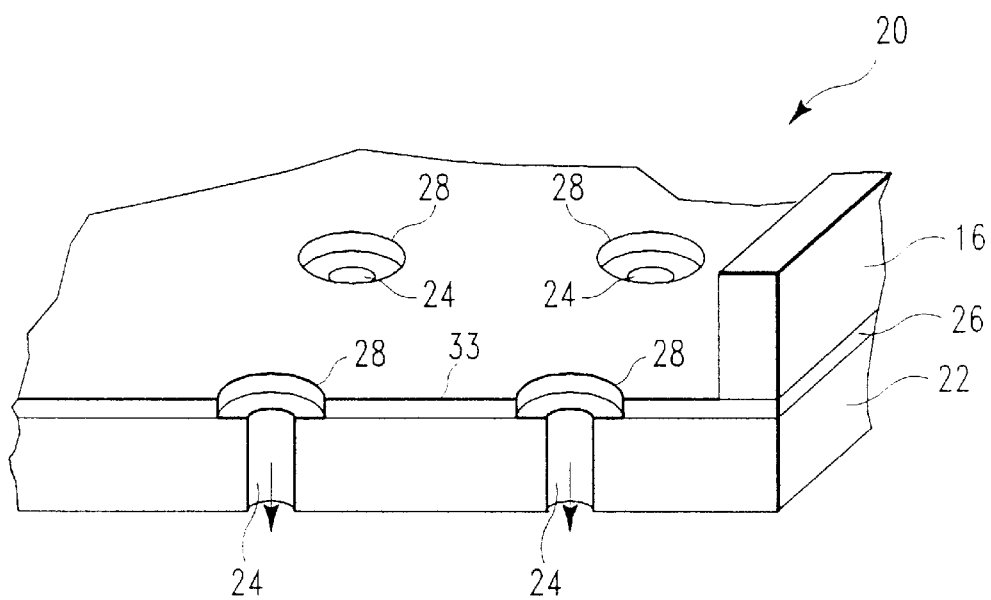
FIG. 3 illustrates a cut-away view of a portion of the fixture of FIG. 2.

Turning now to FIG. 3, a close up cross-section of the base plate 22 and release layer 26 of mold 20 depicted in FIG. 2 are shown in greater detail. The vacuum apertures 28 of the release layer 26 are generally on an order slightly larger than the vacuum apertures 24 of the base plate 22 to allow some tolerance in aligning the release layer 26 to the base plate 22 of mold 20.

Figure 4:
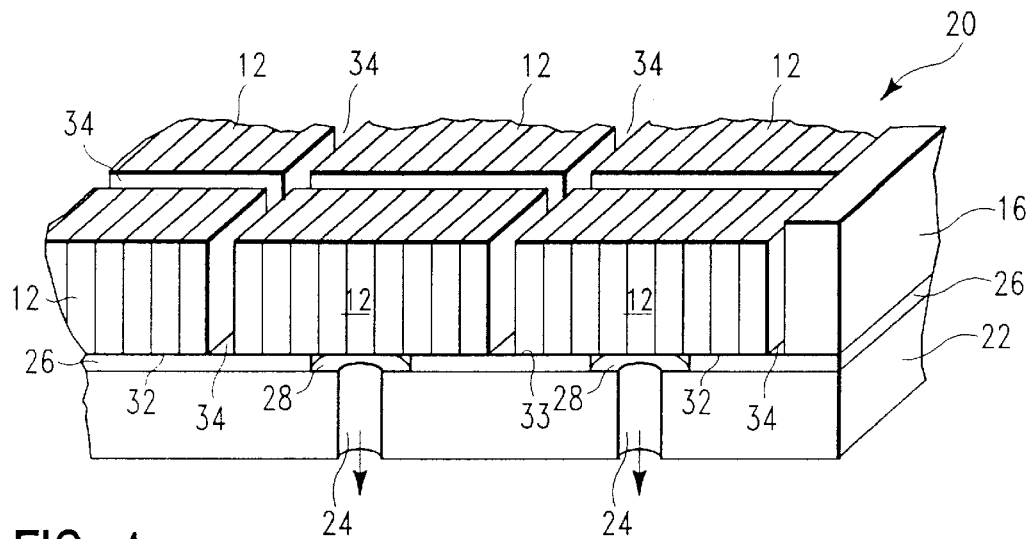
FIGS. 4–9 illustrate process steps in the method of making the multiple cube substrate in accordance with the present invention.

Referring now to FIG. 4, a cross-section is shown illustrating how the multiple cubes 12 are placed within the mold or fixture 20. Cubes 12 can be very accurately placed within the mold 20 using, for example, a robotically controlled vacuum pencil (not shown) as is known in the art. With the vacuum pencil, each cube 12 to be fabricated into the multiple cube substrate 10 of FIG. 1 is picked up and placed upon the release layer 26 in a manner much like a die pick and place tool would pick and place die for a particular placement operation. As the cubes 12 are positioned over a respective vacuum aperture 28 of the release layer 26, a vacuum supplied by a vacuum source (not shown) is applied to a back side of the base plate 22 and the cubes 12 are secured in place. The applied vacuum holds the accurately positioned devices 12 during subsequent molding, to be explained further herein below. It should be noted that prior to beginning of the third phase of processing, each of the multiple cubes 12 preferably has been previously laminated and polished on a processing surface side 32 to give a flat front surface, before being placed and positioned in the molding fixture 20. The processing surface 32 corresponds to that surface which is to undergo further processing (i.e., cube face processing). It is the processing surface 32 of each cube 12 that gets placed onto the release layer 26. The top surface of release layer 26 corresponds to a reference surface 33. In the placement of the cubes 12 upon the reference surface 33, an alignment scheme suitable for a particular alignment of the cubes 12 on the reference surface 33 may be used, as necessary (e.g., split optics).

To load the mold fixture 20 with the multiple cubes 12, each cube 12 is placed onto the reference surface 33 of the release layer 26 with the polished face 32 of the cubes (i.e., the face which will encounter subsequent processing) in contact with the reference surface 33. Suitable alignment can be achieved, for example, by using split optics to reference the face 32 of the cube 12 to the reference surface 33. Vacuum is used to hold each aligned cube 12 securely in place while the appropriate potting material is introduced in gaps 34 between the plurality of cubes 12 as discussed further herein below.

Figure 5:
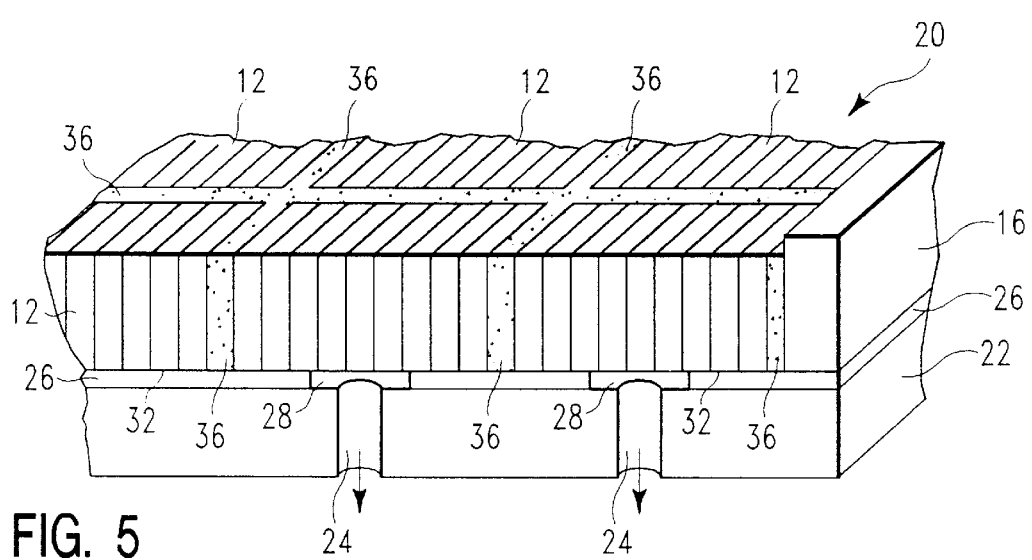

Turning now to FIG. 5, a liquid molding material 36 is added within the gaps 34 between the cubes 12. During dispensing of the liquid molding material 36 between the cubes 12, the cubes 12 are held securely in place by the vacuum applied through the vacuum apertures 28, 24 of the release layer 26 and the base plate 22, respectively, of the mold fixture 20. The vacuum also acts to hold all of the cubes 12 level to the release layer 26 and base plate 22 of the mold 20, thus advantageously creating a flat surface to which all the processing faces 32 of the multiple cubes 12 are referenced against. The processing faces 32 are thus co-planar. Furthermore, the vacuum helps to pull any trapped air through the release layer 26, in the instance when the release layer is formed of an unfired ceramic green sheet or porous ceramic. The vacuum further assists in eliminating the possibility of the formation of any voids in the molded material at the flat reference surface of the release layer positioned upon the mold base.

The molding material 36 includes any suitable molding material which can flow to fill in and around the multiple cubes 12 placed and secured upon the release layer 26. The molding material 36 is preferably one that can be cured at a temperature in the range of under 350° C. In addition, the molding material 36 should be one which does not out gas appreciably during curing. After curing, the cured molding material 36 should be capable of withstanding temperatures in the range of up to 350° C. and still remain structurally strong. The particular molding material 36 is also selected to be one in which it leaves no gaps at the interfaces of the multiple cubes 12. Still further, the molding material 36 should be suitable for being polished, such as, at a same rate as silicon. The molding material 36 still further is selected to have a coefficient of thermal expansion (TCE) as close as possible to that of silicon.

Molding materials, corresponding to rigid potting materials, for use in accordance with the present invention can include high temperature epoxy with silica or ground silicon fill, a slurry of laboratory cement, high temperature package molding compound, low melting point glassy low temperature ceramic polyimides, cast acrylics, polyester resins, and polysilcone or polysulfonone resins.

Preferably, the molding material 36 includes a molding compound of a silica filled polyimide composite. One such compound can be made by mixing silica with Thermid EL-5405 (produced by Ablestik). Thermid EL-5405 is an adhesive used to laminate chips together for making cubes. It is also an imide/isoimide polymer that does not out gas during curing. It cures below 350° C. and is structurally stable to 350° C. The silica adds strength to the material, reduces its TCE, and provides polishing characteristics similar to a cube/silicon/polyimide laminate.

Figure 6:
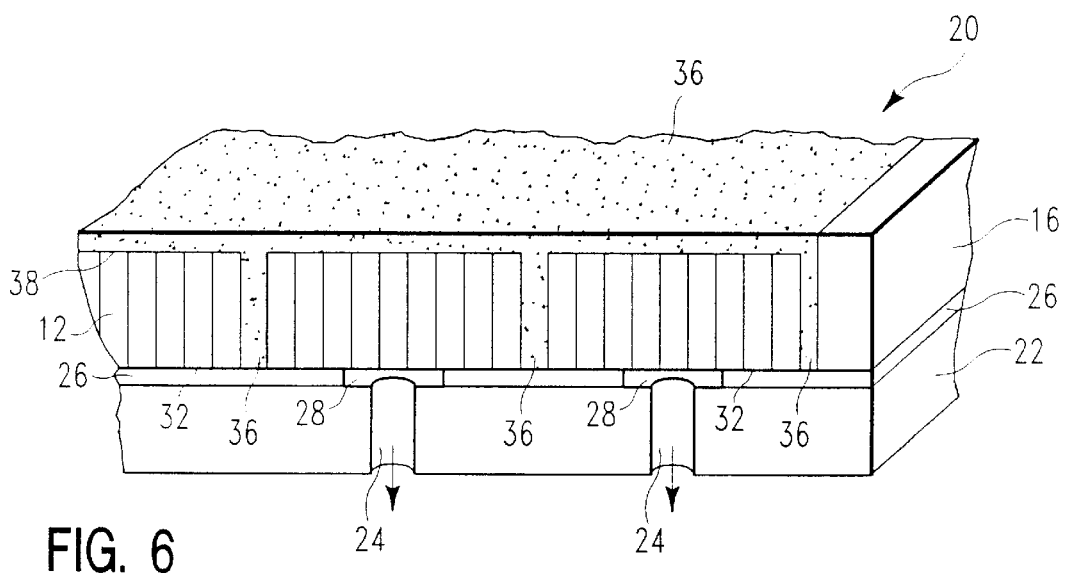

Turning now to FIG. 6, if desired, a back surface 38 of the multiple cubes 12 can be covered with the molding material 36. That is, the containment ring 16 can be made to have a height dimension on the order of larger than a typical height dimension of the multiple cubes 12 to be formed into the multiple cube substrate 10. In that manner, extra molding material 36 may be added to the mold 20 until the back surface 38 of the multiple cubes 12 are covered. After dispensing of the molding material 36, the mold fixture 20 is placed into a vacuum oven (not shown). While in the vacuum oven, the mold fixture 20 is put through a series of bakes to remove solvents and cure the molding material or compound 36, as required according to the curing of the particular molding material or compound 36.

Note that if the molding compound 36 in the mold fixture 20 is not filled such that is covers over the back side 38 of the cubes 12, a metal cover (not shown) can be temporarily placed on top of the back surface 38 of the cubes 12 to ensure the temporary securing of the cubes 12 in place. As a result, the front processing faces 32 of the multiple cubes 12 are kept against the reference surface 33 of the release layer 26 of the mold base 22 during curing.

It should be understood that the molding or potting material 36 is in intimate contact with each cube 12 of the plurality of cubes, thus the gapping problem, as discussed herein above, is advantageously solved.

Figure 7:
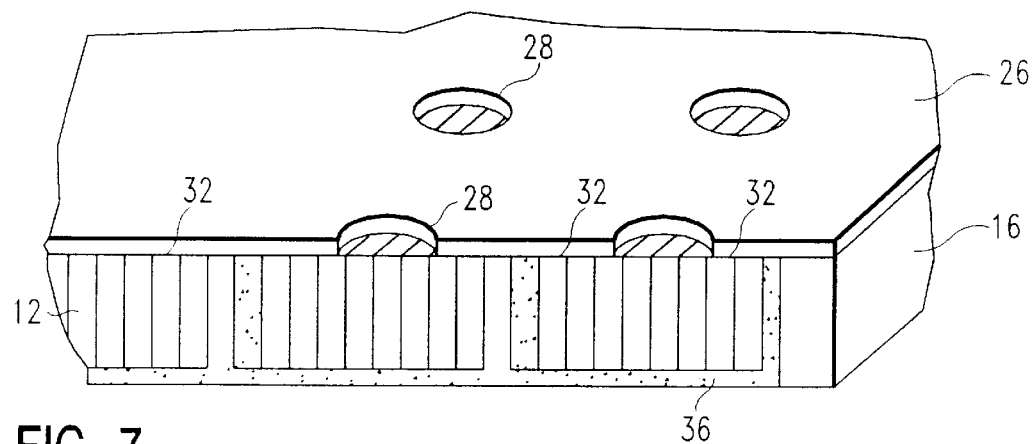

With reference now to FIG. 7, the multiple cube substrate 10 can be removed from the mold fixture subsequent to the molding compound curing step. In the removal of the multiple cube substrate 10 from the mold fixture 20, the containment ring 16 can be kept intact with the multiple cube substrate 10 or it can be removed if properly designed. In addition, some of the molding compound 36 may have seeped into the porous release layer 26 during the dispensing and curing of the molding compound. In the latter instance, the cured seepage may hold the release layer 26 to the multiple cube substrate 10, however, it is weakly held thus allowing the multiple cube substrate 10 to release from the release layer 26 of the mold base 22.

Figure 8:
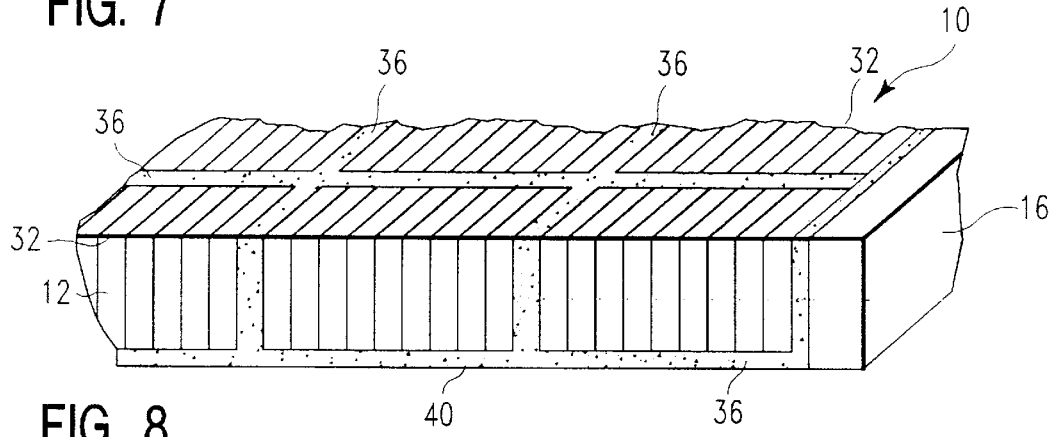

The release layer 26 is removed as shown in FIG. 8. Removal of the release layer 26 is accomplished using any suitable method. For example, in the instance of an unfired ceramic green sheet, the release layer 26 can be removed using water and a brush polish. A finer polish is then done to remove any excess molding compound and to give a smooth flat surface on the multiple cube substrate 10. For example, a fine polish can be carried out using currently available polish tools such as chemical mechanical polishing tools for wafers or slurry polish tools for ceramic substrates. The smooth flat surface 32 corresponds to the processing surface of each cube 12 for which subsequent cube face processing can now be performed. If desired, the containment ring 16 may be kept intact for the purpose of acting as a polish stop for regulating a rate at which polishing of the multiple cube substrate 10 occurs. Additionally, the back side 40 of the multiple cube substrate 10 may also be polished and/or cube face processed as well.

Figure 9:
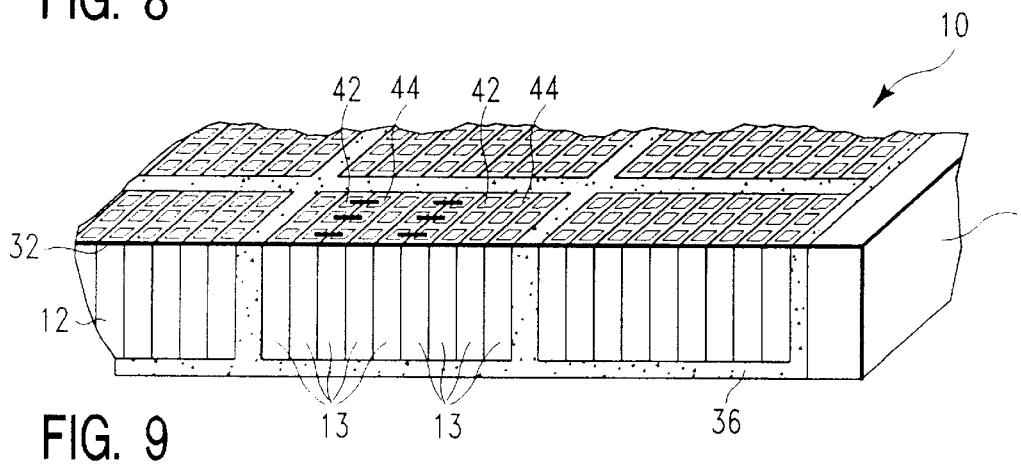

Referring now to FIG. 9, standard cube face processing can be used to interconnect desired ones of the die 13 within each cube 12. The multiple cube substrate 10 can now be further processed as a single unit, such as a standard wafer, through all desired cube face processing of the particular cube face. In accordance with the multiple cube substrate of the present invention, no edge bead effects occur since the cubes 12 are in intimate contact with the molding compound 36. In addition, the size and shape of the multiple cube substrate 10 can be kept a constant even if the size of each cube 12 used to make it up vary in size. With the cubes all pre-aligned, a rough alignment can be used to step to each cube face during a cube face processing. Fine alignment by pattern recognition can be used to perform photolithography on each cube face. Hence, each cube 12 can be processed much like a chip on a wafer or chip site on a ceramic substrate. For example, as shown in FIG. 9, a desired cube face processing may include electrically connecting desired electrical contact points 42 on the reference face 32 of a cube 12 with other electrical contact points 44 on the reference face of the same cube.

Figure 10:
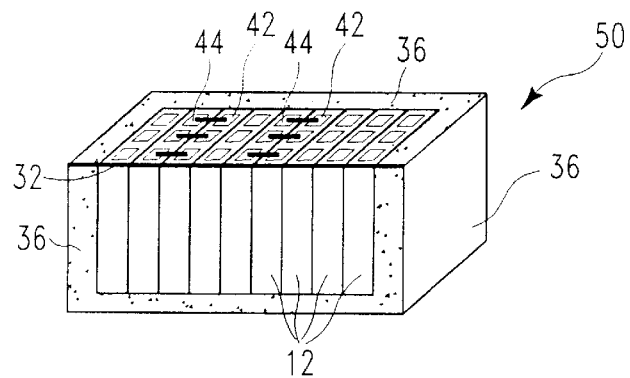
FIG. 10 illustrates an individual processed cube diced from a multiple cube substrate formed in accordance with the present invention.

Upon a completion of a desired cube face processing of the multiple cube substrate 10, the processed cubes can then be sawed or diced from the multiple cube substrate 10 to yield individual processed cubes 50, such as shown in FIG. 10. In the instance of dicing apart individual cubes 12, the containment holder or ring 16 of the molding fixture 20 preferably includes at least two halves, so that the containment holder 16 of the formation fixture 20 can be removed prior to a dicing operation. Alternatively, the potting or molding compound 36 can be removed via chemical removal. Furthermore,, as individual processed cubes, the polyimide/silica composite of the cured molding compound 36 can be left on each cube 12 after dicing to serve as a protective sealant. That is, the cured molding compound 36 may be left in place to act as a sealant on four or five sides of the individual cubes. The protective sealant can protect the die 13 in the cube 12 from damage during handling when mounting to the individual processed cube to a separate substrate. If one dices close enough or just slightly into the die of each cube, the cubes can then be segmented into what shall be referred to as short stacks. Cubes that do not yield from the cube face processing can be repolished and fabricated into a new multiple cube substrate. Still further, the processed cubes may be left as a multiple cube substrate for further processing, for example, to produce a multiple cube module.

Figure 11:
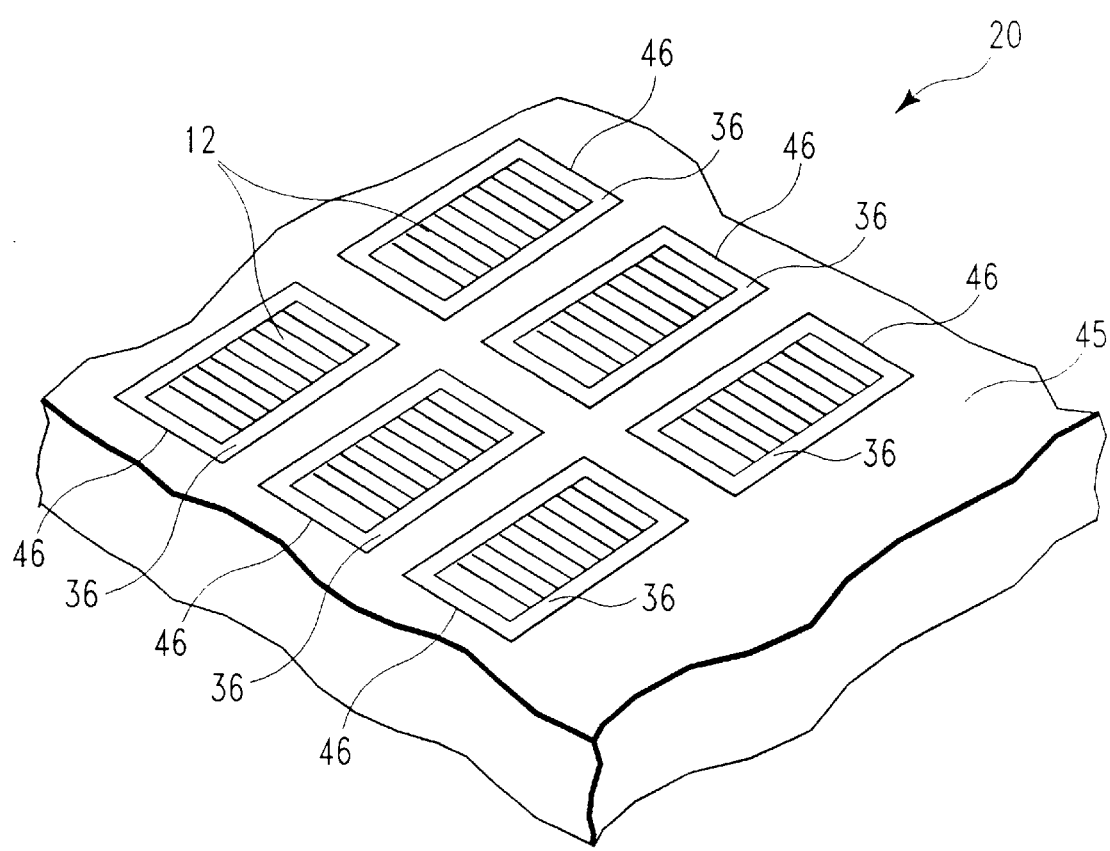
FIG. 11 illustrates an alternate embodiment according to the present invention including the use of a fixture having individual cube cavities.

In accordance with another embodiment of the present invention, rather than pot all of the plurality cubes within a single cavity defined by containment ring 16, the molding fixture 10 may be fitted with a containment layer 45 having individual cavities 46, such as shown in FIG. 11. Using a molding fixture 10 fitted with individual cavities 46, materials such as a thermoplastic, a low melting metal alloy, or a low melting glass can be used as a suitable potting material 36.

In addition, the mold material 36 can add structural stability to the multiple cube substrate 10 for subsequent cube face processing. The mold material 36 can also be a metal or high temperature composite. For example, the molding material 36 can include Ditac, a product commercially available from Dupont, or a composite of it. Ditac is a thermoplastic which dissolves in hot NMP or N-Methylpyrrolidone. The structural stability of the multiple cube substrate 10 comes from the mold material itself. Post processing, the multiple cube substrate 10 can be heated, the cubes popped out of the mold, and then the individual processed cubes cleaned in hot NMP or a solvent suitable for dissolving the molding compound 36 but not adversely affecting the cube face processing. Segmentation of the cubes into short stacks can also be done as desired. The mold 20 can then be reused and cubes that do not yield after cube face processing (i.e., because of defects which occurred during the cube face processing) can be repolished and fabricated into a new multiple cube substrate for rework cube face processing. Thus, subsequent to a desired processing of the multiple cubes in substrate form, the plurality of cubes can be alternatively removed thermally or chemically from the fixture 20.

The present invention thus provides a novel method and apparatus for processing of multiple independent cubes at one time. A multiple cube substrate is used for holding the plurality of individual cubes in a prescribed manner during processing of a desired processing surface of the multiple cubes over a number of process steps. A suitable potting material is used for holding the multiple cubes together in the multiple cube substrate arrangement. The method and apparatus further include dicing through the potting material for separating the plurality of cubes into individual processed cubes, subsequent to completion of a desired processing of the processing surface of the multiple cubes.

In accordance with the present invention, intimate contact between the individual cubes of the plurality of cubes and the potting material advantageously eliminates beading problems. The physical support of the potting material protects individual cube edges. Furthermore, the physical structure allows for more uniform surface grinding during a grinding process step. Still further, only one multiple cube substrate is required for the multiple processing of a plurality of cubes. The single multiple cube substrate can also be adapted or tailored to the particular wafer or ceramic substrate processing equipment. For example, the multiple cube substrate can be made into a circular carrier shape, thus adapting it for use in standard wafer processing equipment. In a similar manner, the multiple cube substrate can be made into a square carrier shape, thus adapting it for use in ceramic or MCM processing equipment.

Figure 12:
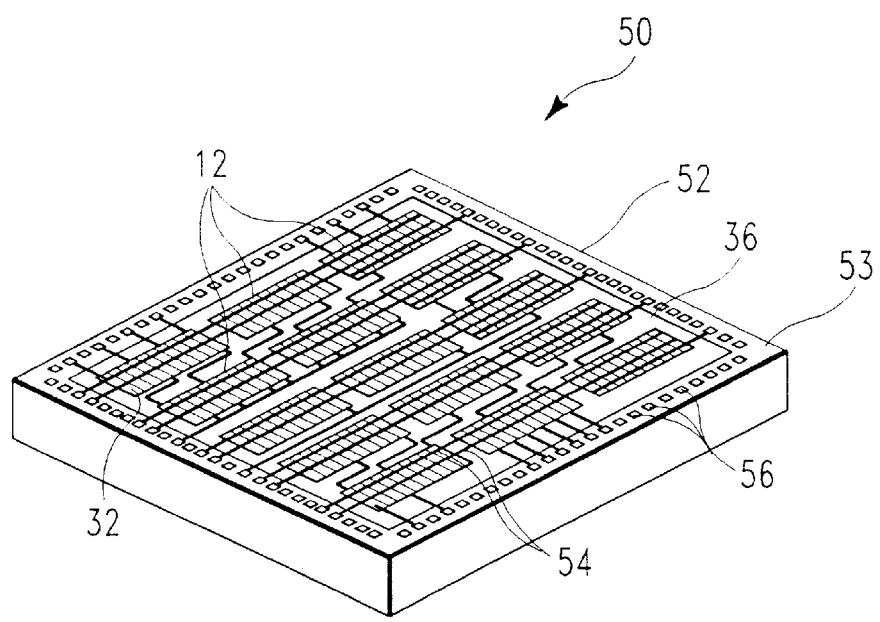
FIG. 12 illustrates an integrated multiple cube substrate having intra-cube connections, inter-cube connections, and connections external to the multiple cube substrate.

Similarly with respect to the above described embodiments, with reference now to FIG. 12, a method of fabricating a semiconductor assembly 50 according to an alternate embodiment of the present invention includes providing a plurality of stacked 3-dimensional semiconductor devices 12 having a reference face 32. The semiconductor devices 12 include a plurality of stacked individual semiconductor dies 13. A processing fixture, including a square-shaped containment holder 52 and having an opening on a bottom surface 53 thereof, is placed onto a reference surface (not shown), the bottom surface being in contact with the reference surface. The reference face of each stack of semiconductor dies are placed onto the reference surface within the processing fixture and temporarily secured in place using vacuum as discussed herein above. The processing fixture is then filled with a potting material 36 to effectively fix each stack of semiconductor dies within the processing fixture. Subsequent to a curing of the potting material, the processing fixture can be inverted, separated from the reference surface, and thereby expose the reference face of the plurality of stacked semiconductor dies. Electrical interconnections 54 between the plurality of individual semiconductor dies on the reference face can then be formed as necessary for a particular application. As shown in FIG. 12, containment holder 52 is provided with a plurality of output pads 56 corresponding to C4 or wirebond pads as may be required for a particular multiple cube substrate application.

According to the present invention, a plurality of semiconductor cubes, post lamination and one side polishing, are placed into a molding fixture or holder and aligned as necessary. Vacuum is used to temporarily secure each cube in place on the reference surface. The cubes are then potted in a suitable material, fixing them in place within the holder. All subsequent interconnection processing steps on respective cube faces is then performed. The interconnection processing can include, for example, internal cube wiring (intra-cube), cube to cube wiring (intercube), and cube to output pad wiring (external). In one embodiment, the containment ring portion 16 of the mold or holder 20 becomes a permanent part of a multiple cube substrate 10 thus formed, without output pads formed thereon such as shown in FIG. 1. Alternatively, the containment ring 16 can be for use only as a mold during processing, wherein the containment ring is removed after desired wiring is completed.

In accordance with the present invention, it is also possible to perform a wiring process on a backside of the multiple cube substrate 10 as well. For example, power distribution wiring could be implemented on the back side and signal wiring implemented on the front side, or the multiple cube substrates themselves could be coupled together in a stacked arrangement. Multiple cube processing according to the present invention thus includes both front side processing and backside processing.

As discussed herein above, the mold fixture confinement ring 16 defines a shape of the multiple cube substrate 10. The multiple cube substrate 10 acts as a vehicle to hold, support, and protect the cubes 12 through all subsequent cube face processing. Subsequent cube face processing includes, but is not limited to: grinding, polyimide and resist apply, thermal processing, chemical etching, and photolithography. At the end of cube face processing, the mold material 36 can be diced or dissolved away to yield individual cubes. An alternate extension of the multiple cube processing would be to keep the molded cubes together and use the substrate as a structure on which to further extend cube integration by applying thin films, connecting logic chips, and making connections to the outside world, as shown in FIG. 12.

The multiple cube substrate structure 10 according to the present invention advantageously allows many cubes to be processed at once. For example, the multiple cube substrate may be molded into a 127 mm square substrate. A 127 mm square substrate is the size of a typical multi-layer ceramic (MLC) substrate. As a result, the same grinding tools, polyimide and resist apply tools, photolithography tools, ovens, dicing tools and fixtures used to process MLC substrates can be used to process the multiple cube substrates of the present invention with little or no modification. The latter benefit is important from a cost of tooling stand point. Similarly, a round multiple cube substrate could also be made and thus similarly utilize existing wafer tooling to process the multiple cube substrates.

With the present invention, a cost of the mounting and the dicing process steps is offset many times by the processing ease and cost savings incurred through the subsequent processing of the multiple cube substrates.

The present invention thus provides molding of a three dimensional (3D) semiconductor device stacks, especially silicon memory stacks, into a substrate to facilitate low cost, simplified cube face processing of multiple cubes at one time. Edge bead build-up of applied resists or polyimide on individual cubes is eliminated by moving an effective edge bead to the edge of the substrate away from the active area of the cube faces. The molding material can be used as a sealing layer to hermetically seal all of the die or chips in each stack. Chipping and handling damage of individual cubes is reduced by use of the protective molding material. Lastly, the molding material can be diced or removed by suitable methods at the end of processing to yield individual processed cubes. On the other hand, if dicing is not carried out, the molded substrate creates a structure on which further interconnection between cubes, logic chips, and the outside world (external to the multiple cube substrate) can take place.

While the invention has been particularly shown and described with reference to specific embodiments thereof, it will be understood by those skilled in the art that various changes in form and detail may be made thereto. Other embodiments of the present invention beyond embodiments specifically described herein may be made or practiced without departing from the spirit and scope of the present invention as limited solely by the appended claims.

What is claimed is:

1. A method of making a structure comprising the steps of:
   providing a plurality of devices, each device including a semiconductor die, each device having a reference face;
   positioning the reference face of each of the plurality of devices upon a planar reference surface; and
   molding the devices together using a molding compound without squeezing all said devices together.

2. The method of claim 1, wherein
   molding the devices together includes
   providing a molding fixture including a release layer corresponding to the planar reference surface and a containment member coupled to the release layer, the containment member defining a desired outer dimension of the multiple 3-dimensional semiconductor device substrate yet to be formed, the release layer further characterized by vacuum apertures disposed therein, wherein the plurality of devices can be precisely aligned in a prescribed manner upon the release layer and wherein application of a vacuum source to the vacuum apertures holds the plurality of aligned devices at their respective reference faces in the molding fixture;
   dispensing the molding compound into gaps occurring between adjacent side faces of the plurality of devices other than the reference faces; and
   curing the molding compound.

3. The method of claim 2, wherein the release layer includes an unfired ceramic green sheet.

4. The method of claim 2, further comprising the step of removing the release layer.

5. The method of claim 4, still further comprising the step of removing the containment member.

6. The method of claim 1, further comprising the step of:
   subjecting the reference faces of the plurality of devices in the form of a multiple 3-dimensional semiconductor device substrate to subsequent face processing.

7. The method of claim 6, wherein each device further includes electrical contact points on the reference face thereof, said method further comprising the step of:
   electrically connecting desired contact points on the reference face of an individual device with other contact points on the reference face of the same device of the multiple 3-dimensional semiconductor device substrate.

8. The method of claim 6, wherein each device further includes electrical contact points on the reference face thereof, said method further comprising the step of:
   electrically connecting desired contact points on the reference face of a first device with desired contact points on the reference face of a second device of the multiple 3-dimensional semiconductor device substrate.

9. The method of claim 6, wherein each device further includes electrical contact points on the reference face thereof, said method further comprising the step of:
   electrically connecting desired contact points of an individual device of the multiple 3-dimensional semiconductor device substrate with an external device.

10. The method of claim 6, further comprising the step of separating individual devices of the multiple 3-dimensional semiconductor device substrate into individual reference face processed devices.

11. The method of claim 10, wherein the molding compound remains on at least one side of the individual reference face processed devices.

12. The method of claim 11, wherein the molding compound remains on four sides of the individual reference face processed devices.

13. The method of claim 11, wherein the molding compound remains on five sides of the individual reference face processed devices.

14. The method of claim 1, wherein said step of molding the devices together includes
   providing a release layer corresponding to the planar reference surface and a molding template coupled to the release layer, the molding template having individual apertures each of a sufficient size for receiving an individual device therein, the release layer characterized by vacuum apertures disposed therein, the apertures of the molding template overlying the vacuum apertures disposed in the release layer, wherein the plurality of devices can be precisely aligned in a prescribed manner upon the release layer within an individual aperture of the molding template and wherein application of a vacuum source to the vacuum apertures holds the plurality of aligned devices at their respective reference faces within the individual apertures of the molding template;
   dispensing the molding compound into gaps occurring between a respective molding template aperture side wall and side faces of the plurality of devices other than the reference faces; and
   curing the molding compound.

15. A method of making a multiple cube substrate comprising the steps of:
   providing a plurality of cubes, each cube including a stack of individual semiconductor die laminated together and having one face polished, each cube further requiring a cube face processing upon the polished cube face;
   providing a molding fixture including a release layer and a containment member coupled to the release layer, the containment member defining a desired dimension of the multiple cube substrate yet to be formed, the release layer further characterized by vacuum apertures disposed therein;

placing the plurality of cubes, polished face down, in desired positions upon the release layer, wherein upon application of a vacuum source the vacuum apertures hold down the plurality of cubes in the molding fixture, further wherein gaps occur in between adjacent cubes;

dispensing a molding compound into the gaps; and curing the molding compound without squeezing all said cubes together.

* * * * *